United States Patent
Marcoccia et al.

(10) Patent No.: US 11,699,677 B2
(45) Date of Patent: Jul. 11, 2023

(54) DIE-TO-WAFER BONDING UTILIZING MICRO-TRANSFER PRINTING

(71) Applicant: OpenLight Photonics, Inc., Goleta, CA (US)

(72) Inventors: Roberto Marcoccia, San Jose, CA (US); Benjamin M. Curtin, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 265 days.

(21) Appl. No.: 16/917,492

(22) Filed: Jun. 30, 2020

(65) Prior Publication Data
US 2021/0407959 A1 Dec. 30, 2021

(51) Int. Cl.
*H01L 23/00* (2006.01)
*B41F 16/00* (2006.01)

(52) U.S. Cl.
CPC .......... *H01L 24/83* (2013.01); *B41F 16/0046* (2013.01); *B41F 16/0073* (2013.01); *H01L 24/97* (2013.01)

(58) Field of Classification Search
CPC ......... H01L 24/83; H01L 24/80; H01L 24/97; H01L 2221/68318; H01L 2221/68354; H01L 21/6835; H01L 2224/80006; H01L 2224/8009; H01L 2221/6836; H01L 2224/80013; B41F 16/0046; B41F 16/0073
USPC ....................................................... 438/118
See application file for complete search history.

(56) References Cited

U.S. PATENT DOCUMENTS

| | | | | |
|---|---|---|---|---|
| 7,214,567 B2* | 5/2007 | Yamagata | ............... | H01L 24/27 438/106 |
| 7,772,039 B2* | 8/2010 | Kerber | ..................... | H01L 22/34 438/118 |
| 7,824,734 B2* | 11/2010 | Wessels | ................. | B82Y 40/00 438/149 |
| 8,546,190 B2* | 10/2013 | Vai | ...................... | H01L 21/6836 438/126 |
| 11,322,367 B1* | 5/2022 | Su | ..................... | H01L 21/67092 |
| 2010/0317132 A1* | 12/2010 | Rogers | ............... | H01L 21/6835 257/E33.059 |
| 2013/0149817 A1* | 6/2013 | Jeon | ........................ | H01L 25/50 438/118 |
| 2014/0334768 A1* | 11/2014 | Chang | .................. | G02B 6/4204 438/27 |

(Continued)

FOREIGN PATENT DOCUMENTS

| CN | 113871328 A | 12/2021 |
|---|---|---|
| TW | 202203406 A | 1/2022 |
| WO | 2010132552 | 11/2010 |

OTHER PUBLICATIONS

"European Application Serial No. 20197559.6, Extended European Search Report dated Feb. 17, 2021", 9 pgs.

*Primary Examiner* — Khiem D Nguyen
(74) *Attorney, Agent, or Firm* — Schwegman Lundberg & Woessner, P.A.

(57) ABSTRACT

Described herein is a die-to-wafer bonding process that utilizes micro-transfer printing to transfer die from a source wafer onto an intermediate handle wafer. The resulting intermediate handle wafer structure can then be bonded die-down onto the target wafer, followed by removal of only the intermediate handle wafer, leaving the die in place bonded to the target wafer.

16 Claims, 7 Drawing Sheets

(56) References Cited

U.S. PATENT DOCUMENTS

| | | |
|---|---|---|
| 2016/0016399 A1 | 1/2016 | Bower et al. |
| 2016/0133496 A1* | 5/2016 | Lambert ................. H01L 24/27 |
| | | 438/118 |
| 2018/0138071 A1* | 5/2018 | Bower .................... H01L 24/14 |
| 2019/0057957 A1* | 2/2019 | Xie ......................... G01S 17/86 |
| 2019/0096774 A1 | 3/2019 | Chaji |
| 2020/0235059 A1* | 7/2020 | Cok ........................ H01L 24/73 |

* cited by examiner

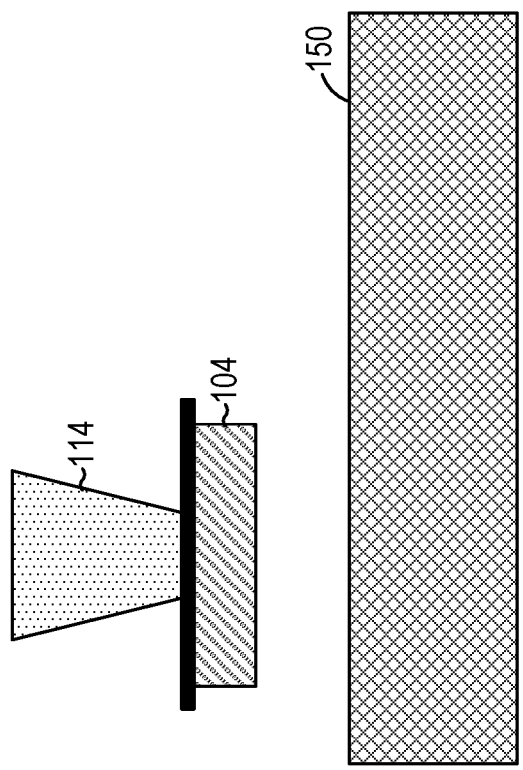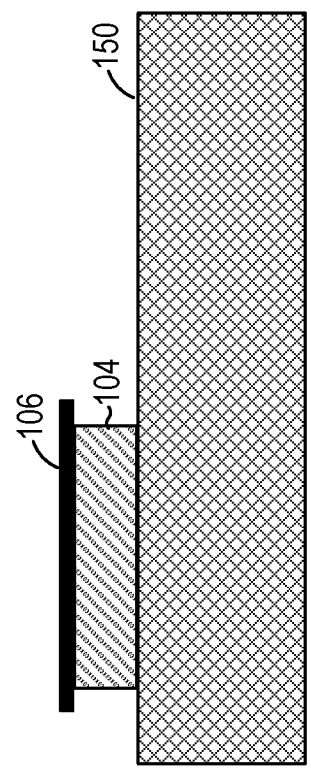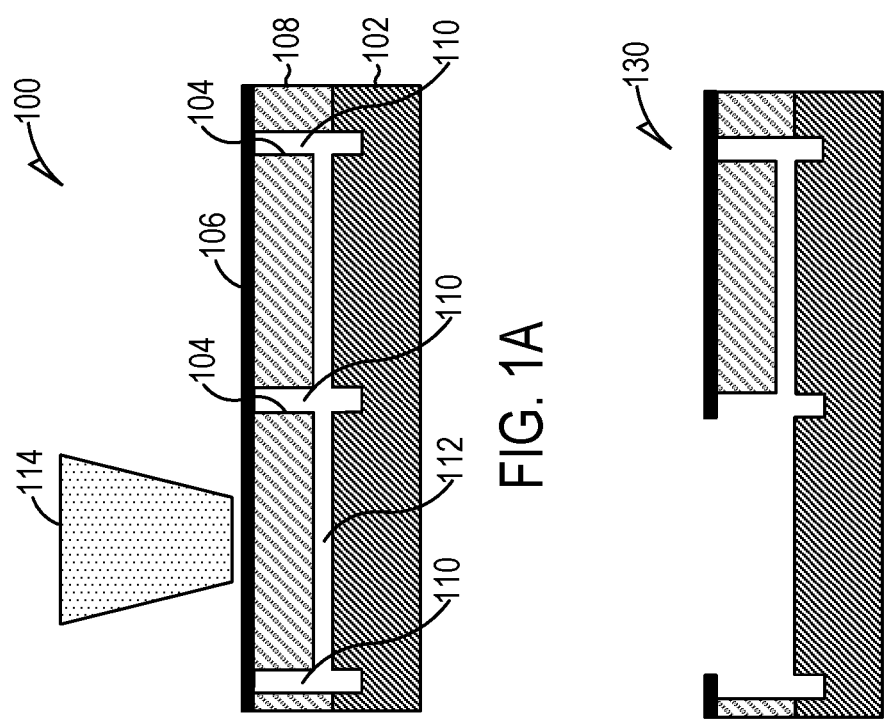

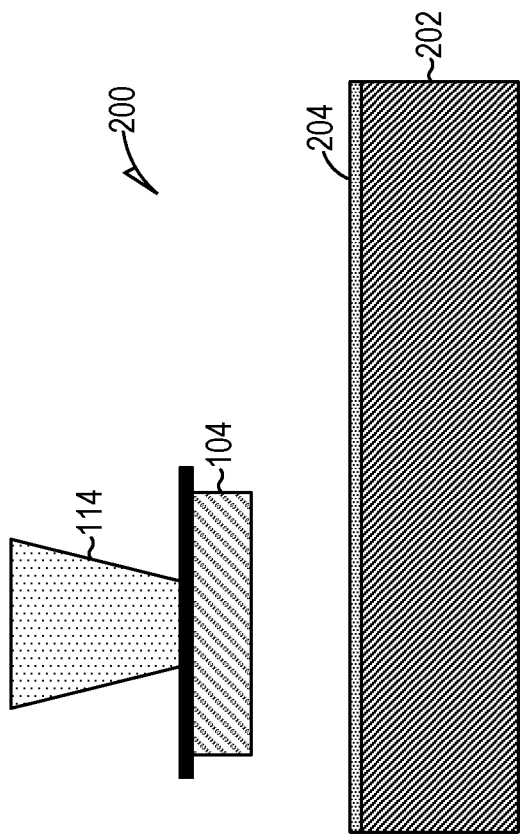
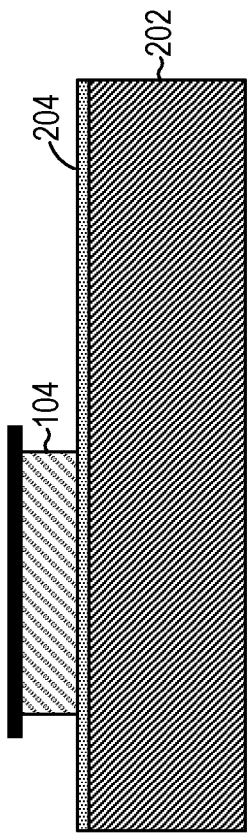
FIG. 3A
FIG. 3C
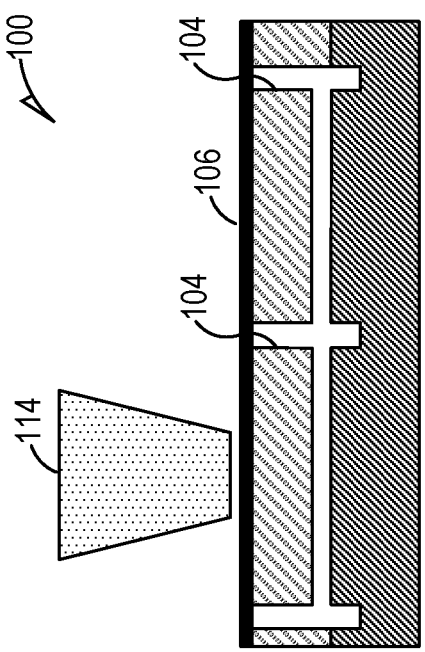
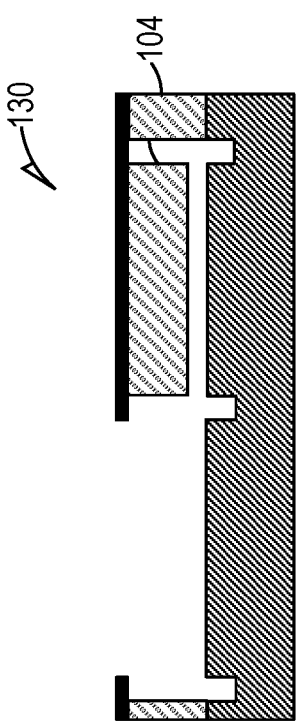
FIG. 3B
FIG. 3D

DIE-TO-WAFER BONDING UTILIZING MICRO-TRANSFER PRINTING

TECHNICAL FIELD

This disclosure relates to processes for die-to-wafer bonding, for example, for manufacturing heterogeneous photonic integrated circuits (PICs).

BACKGROUND

Manufacturing PICs often involves bonding die cut from a wafer of one material to a substrate wafer of another material. For example, heterogeneous integration of passive photonic devices formed in the device layer of a silicon-on-insulator (SOI) substrate wafer with active photonic devices implemented with III-V compound semiconductor materials may be achieved by bonding III-V die to a patterned SOI wafer in the appropriate locations, followed by patterning the III-V die to create the active devices. While the die placement onto the substrate can be accomplished with conventional pick-and-place machines, handling die in this manner imposes lower limits on the size of the die. An alternative manufacturing process that decreases the lower size limit and thus enables the use of smaller die, which offer the potential for cost savings and throughput improvements, is desirable.

BRIEF DESCRIPTION OF THE DRAWINGS

In the following description of embodiments of the disclosed subject matter, reference is made to the accompanying drawings. In the drawings, various fill patterns are used to visually distinguish different depicted structural components that may (but need not in every case) differ in material; the fill patterns for any given component are used consistently throughout the drawings. It is noted, however, that the fill patterns are not intended to indicate any particular material. Rather, various example materials are listed in the description.

FIGS. 1A-1D are cross-sectional views of a source wafer and a target wafer at various stages of a conventional micro-transfer printing process.

FIGS. 3A-3D are cross-sectional views of the source wafer and the intermediate handle wafer at various stages of micro-transfer printing of a die from the source wafer onto the intermediate handle wafer, in accordance with various embodiments.

DESCRIPTION

Figure 2A:
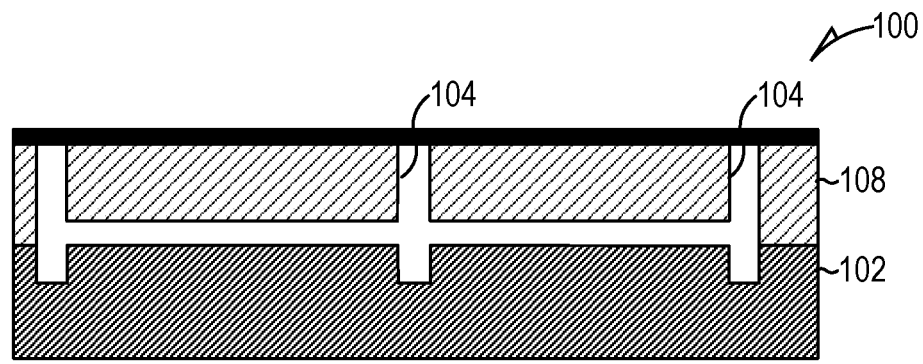
FIGS. 2A-2C are cross-sectional views of a source wafer, an intermediate handle wafer, and a target wafer, respectively, as used in die-to-wafer bonding utilizing micro-transfer printing, in accordance with various embodiments.

Described herein is a die-to-wafer bonding process that utilizes an adaptation of micro-transfer printing to bond die upside down onto a target wafer. Micro-transfer printing is a manufacturing technique that uses a micro-transfer printing stamp, e.g., made from a polymer, to pick up suspended die from a source wafer and, conventionally, places them onto a target wafer for bonding. Transferring die from one wafer to another in this manner allows for much smaller die than using conventional pick-and-place machines: while the latter generally work with die sizes on the order of millimeters or at least hundreds of micrometers, micro-transfer printing can handle die sizes of merely tens of micrometers. However, in many semiconductor device manufacturing processes, micro-transfer printing, without further steps or adjustments, cannot readily be substituted for die transfer with pick-and-place machines. One problem is that the epitaxial materials from which the die are cut are often grown above the source wafer substrate upside down, with the layer that ultimately will be the top layer of the device grown first, and the layer that will be bonded to the target wafer ending up at the top of the epitaxial stack. Pick-and-place machines can be configured for flip-chip bonding to turn the die to the desired orientation before placing them onto the target wafer. Micro-transfer printing, however, does not allow for flipping the chip, as the polymer stamp, which is brought in contact with the top surface of the source wafer to pick up the die, remains in contact with that top surface throughout the entire pick-and-place process. Another problem is that the bond between die and target wafer is, in many semiconductor device manufacturing processes, established by plasma bonding, which is incompatible with a polymer-stamp-based die transfer, as the plasma might damage the stamp material.

In accordance with the disclosed subject matter, these challenges are overcome by utilizing an intermediate handle wafer to facilitate the use of micro-transfer printing. In various embodiments, the intermediate handle wafer is coated with an adhesive layer (e.g., an epoxy or photoresist) to which the die are attached by micro-transfer printing. The resulting intermediate handle wafer structure including the die can then be flipped and bonded die-down onto the target wafer. The bonding surfaces of the die, the target wafer, or both may be plasma-activated to cause formation of an initial bond between the die and target wafer upon placement, and the initial bond may then be annealed by application of heat and/or pressure, or by vacuum-assisted wafer-to-wafer bonding, to create a permanent bond. The bonding process may include aligning the intermediate handle wafer structure with the target wafer (e.g., by infrared through-wafer alignment) prior to formation of the initial bond. Upon completion of bonding, the intermediate handle wafer substrate and the adhesive layer that coats it may be removed, leaving behind the target wafer with the die bonded to it. Removal of the intermediate handle wafer and adhesive layer may be achieved, e.g., by wet etching.

The source wafer may include a top layer of tether material (such as, e.g., silicon nitride, a silicon oxide, or photoresist) from which the die are suspended. The micro-transfer printing stamp, when picking the die from the source wafer, is brought in contact with that tether material at the locations of the die. In some embodiments, the tether material is removed from the die (e.g., by a wet etch) prior to bonding the intermediate handle wafer structure die-down onto the target wafer. In other embodiments, the tether material is kept on the die to form part of the device structure of a device to be formed in the die.

In various embodiments, the die include multiple layers of material, and at least one of the layers differs from the material of the target wafer. For example, in one embodiment, the target wafer is a silicon-on-insulator wafer, and the die are made of compound semiconductor (e.g., III-V) materials. The die may be formed in the source wafer by selectively etching a lift-off layer formed in the source wafer between a substrate layer and a layer comprising the die. In some embodiments, the die have one or more lateral dimensions of less than 500 μm. A smallest lateral dimension of the die may be less than 100 μm (e.g., about 30 μm in some embodiments). To create device structures, the target wafer may be patterned prior to bonding the intermediate handle with the die onto the target wafer, and the die may be patterned after bonding to the target wafer.

The foregoing will be more readily understood from the following detailed description of the accompanying drawings.

FIGS. 1A-1D are cross-sectional views of a source wafer and a target wafer at various stages of a conventional micro-transfer printing process. FIG. 1A shows, in a simplified schematic, the source wafer 100, which includes a host substrate layer 102 and a plurality of die 104 (only two being shown) suspended from a layer of tether material 106 (hereinafter also "tether layer" or "tether material") disposed across the top surface. The substrate layer 102 and die 104 may be made, e.g., of compound semiconductor materials, such as indium phosphide (InP), indium arsenide (InAs), gallium arsenide (GaAs), gallium nitride (GaN), or indium antimonide (InSb), or other III-V materials, but II-VI compound or other semiconductor materials may also be used. The die 104 are often formed in a stack of epitaxially grown layers 108 (herein collectively "epi layers") of multiple different materials. The tether layer 106 is generally made of a sacrificial material rigid enough to anchor the suspended die 104 to the host substrate while breaking with minimal deformation from adhesive forces after stamp contact and retraction. For example, the tether layer 106 may be made of silicon nitride, silicon oxide, photoresist, or some other dielectric material. In some embodiments, the tether layer 106 has a thickness of a several tens of nanometers.

To create the source wafer 100, a sacrificial layer (herein also "lift-off layer") may be disposed on top of the substrate layer 102, and the epi layers 108 may then be grown epitaxially on the sacrificial layer and covered with the tether layer 106. The sacrificial layer is generally made of a material that has a higher etch rate than the materials of the substrate layer 102 and epi layers 108 and can, thus, be preferentially etched; suitable materials for the sacrificial layer include, for example, indium gallium arsenide (InGaAs) and indium aluminum arsenide (InAlAs) for epitaxial growth on InP substrates. The epi layers 108 may be patterned (e.g., by photolithographic patterning and etching) to form channels 110 defining the lateral boundaries of the individual die 104; the tether layer 106 includes openings (not shown) in certain areas to expose the epi layers 108 to the etchant. The sacrificial layer material can then likewise be exposed to a suitable etchant (e.g., $FeCl_3$:H2O for InAlAs/InP). The sacrificial material is thereby removed, leaving an undercut 112 that forms the die 104 as structures physically unconnected from the source wafer 100 except for their suspension from the tether layer 106. Note that the tether layer 106 is, in some areas, anchored to the substrate layer 102, either directly or via epi layer structures 108 that break through the sacrificial layer (as shown on the left and right edges of the wafer 100 shown).

To transfer the die 104 from the source wafer 100 to the target wafer, micro-transfer printing stamp 114, e.g., made of a polymer (such as, for instance, polydimethylsiloxane (PDMS) or some other viscoelastic polymer), is brought in physical contact with the tether layer 106 in a region above a die 104. The tether-coated die 104 attaches to the stamp 114 via van der Waals forces, with a strength of adhesion that generally increases with the speed with which the stamp 114 is moved. By lifting the stamp 114 at high speed, it is possible to tear the tether layer 106 along the boundaries of the die 104 and thereby remove the die 104 from the source wafer 100; the resulting source wafer structure 130 is shown in FIG. 1B. The stamp 114 can then carry the die 104 over to the target wafer 150, as shown in FIG. 1C. The target wafer 150 is generally of a different material than the die 104. For example, the target wafer 150 may be a silicon-on-insulator (SOI) wafer or other group-IV semiconductor wafer, to which III-V die 104 are bonded for heterogeneous integration. Optionally, the target wafer 150 may include a thin oxide (or other insulating) coating (not shown). Upon placement of the die 104 on, and bonding to, the surface of the target wafer 150, the polymer stamp 114 can be slowly detached from the die 104. FIG. 1D shows the resulting die 104 bonded to the target wafer 150. The stamp may now be reused to pick up the next die 104. Note that, while FIGS. 1A-1D illustrate, for simplicity, transfer of only one die 104 at a time, the depicted stamp 114 may generally form one among an array of many protrusions extending from a larger polymer stamp that can pick up a corresponding array of many die 104 simultaneously, and print the die onto the target wafer 150 in the same geometric arrangement in which they were placed within the source wafer 100.

As will be appreciated by those of ordinary skill in the art, micro-transfer printing as illustrated in FIGS. 1A-1D results in the die 104 being disposed on the target wafer 150 in the same orientation as they are grown on the source wafer 100. To facilitate flipping the die 104 between pick-up from the source wafer 100 and bonding to the target wafer 150, micro-transfer printing in accordance with various embodiments is extended to a two-stage process that utilizes an intermediate handle waver, as described in more detail in the following.

Figure 2B:
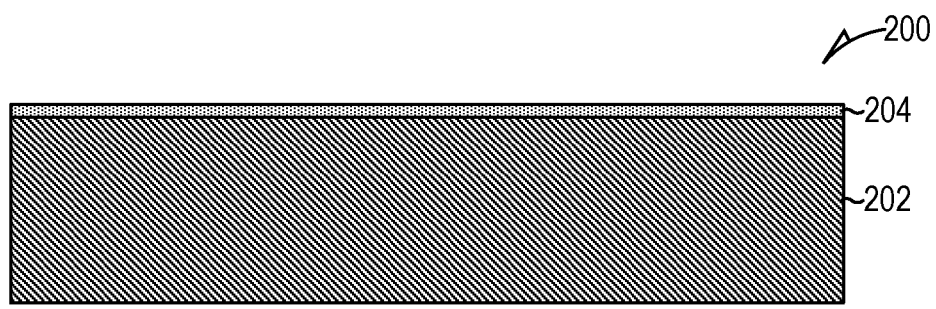
Figure 2C:
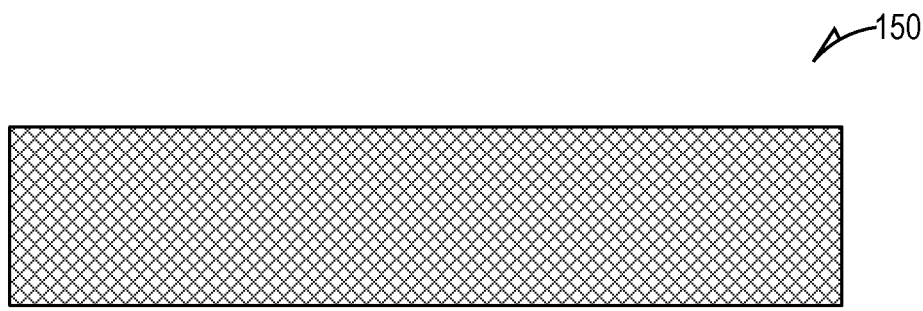

FIGS. 2A-2C are cross-sectional views of a source wafer 100, an intermediate handle wafer 200, and a target wafer 150, respectively, as used in die-to-wafer bonding utilizing micro-transfer printing, in accordance with various embodiment. As can be seen, the source wafer 100 and target wafer 150 may be the same as used in conventional micro-transfer printing as illustrated in FIGS. 1A-1D. For example, in some embodiments, the source wafer 100 includes an array of die 104 formed in a stack of epi layers 108 of III-V semiconductor material above an InP substrate layer 102, and the target wafer 150 is an SOI wafer (optionally with a thin layer of oxide or other insulating material on top). The intermediate handle wafer 200 includes a substrate 202 (e.g., of silicon, glass, or any other common wafer material) coated by a thin adhesive layer 204, which may be made, e.g., of epoxy or photoresist.

FIGS. 3A-3D are cross-sectional views of the source wafer and the intermediate handle wafer at various stages of micro-transfer printing of a die from the source wafer onto the intermediate handle wafer, in accordance with various embodiments. To pick up the die 104 from the source wafer 100, a polymer stamp 114 is brought in contact with the tether layer 106 disposed above the die 104, as shown in FIG. 3A, and then lifted to break the die 104 out of the source wafer 100 just as in conventional micro-transfer printing; FIG. 3B shows the resulting structure of the source wafer 130 with the die 104 removed. The polymer stamp 114 with the tether-coated die 104 attached is moved over to the intermediate handle wafer 200, as shown in FIG. 3C, where the die 104 is placed down onto the adhesive layer 204 covering the substrate 202 of the intermediate handle wafer 200. The polymer stamp is then lifted off, leaving the (still tether-coated) die 104 adhered to the intermediate handle wafer 200 (collectively, structure 300), as shown in FIG. 3D.

Figure 4A:
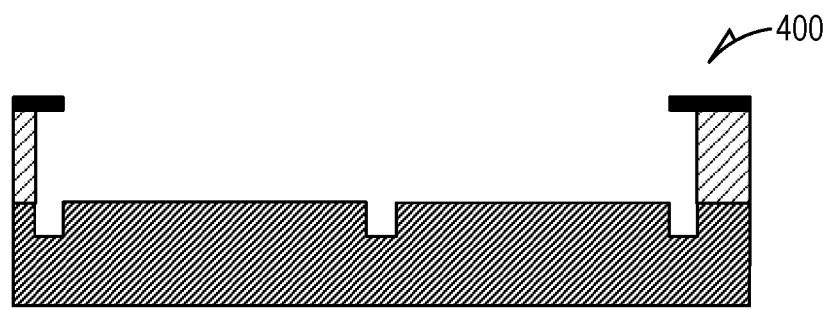
FIGS. 4A and 4B are cross-sectional views of the source wafer structure and the intermediate handle wafer structure, respectively, resulting from micro-transfer printing of multiple die from the source wafer onto the intermediate handle wafer, in accordance with various embodiments.
Figure 4B:
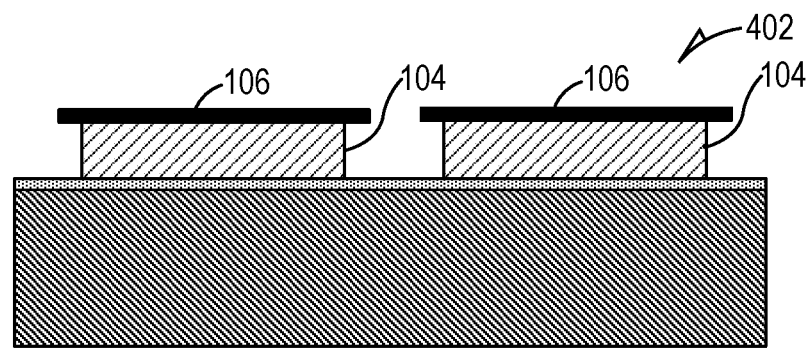

FIGS. 4A and 4B are cross-sectional views of the source wafer and the intermediate handle wafer structure, respectively, after micro-transfer printing of multiple die from the source wafer onto the intermediate handle wafer, in accordance with various embodiments. For simplicity, the depiction shows only two die 104 removed from the source wafer (resulting in structure 400) and printed onto the intermediate handle wafer (resulting in structure 402). Of course, many more die 104 may be transferred to the intermediate handle wafer in many practical applications. The transfer of multiple die 104 may involve repeating the transfer process (as illustrated in FIGS. 3A-3D) multiple times. Alternatively or additionally, as noted above, the polymer stamp 114 may be structured to simultaneously pick up and print multiple die 104, e.g., arranged within an array that matches a corresponding array of protrusions from the polymer stamp 114. While simultaneous micro-transfer printing of multiple die 104 results in a die configuration in the intermediate handle wafer structure 402 that mirrors the arrangement of those die 104 in the source wafer 100, separate micro-transfer printing of individual die 104 (or arrays of die) provides flexibility in placing the die 104 at any location. Note also that die from multiple different source wafers may be combined onto the same intermediate handle wafer.

Figure 5:
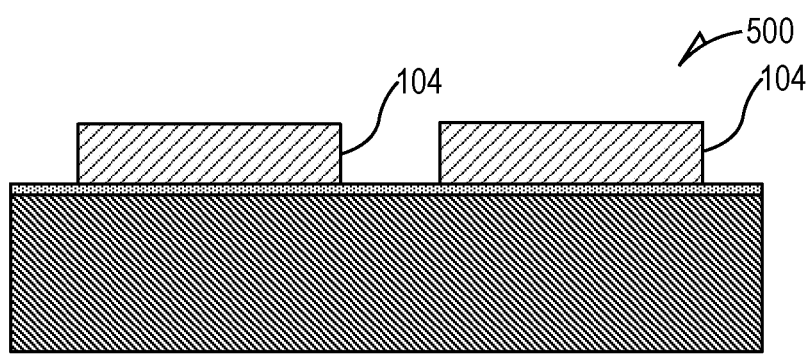
FIG. 5 is a cross-sectional view of the intermediate handle wafer structure after removal of a tether material in accordance with various embodiments.

FIG. 5 is a cross-sectional view of the intermediate handle wafer structure of FIG. 4B after removal of the tether material 106, in accordance with various embodiments. Removal of the tether material 106 may be accomplished by polishing the tether material 106 back mechanically (also known as "lapping"), or by wet-etching, e.g., with a solvent (also known as a solvent strip) or acid-based etchant. In the resulting intermediate handle wafer structure 500, the topmost layer of the die 104 as grown on the source wafer 100 is exposed, ready for bonding onto the target wafer 150. Note that the tether material 106 need not be removed in all embodiments. For some applications, the tether material 106 may fulfill a functional role in the heterogeneous device structure, and may, accordingly, be kept to form the bottom layer of the bonded die. For purposes of the following description and depiction of the die in the figures, the tether material 106 is deemed to have been removed.

Figure 6A:
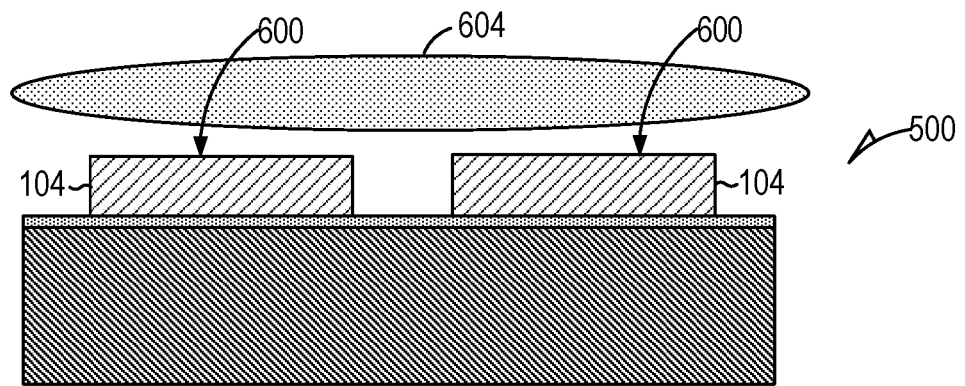
FIGS. 6A and 6B are cross-sectional views of the intermediate handle wafer structure and the target wafer, respectively, during plasma activation in accordance with various embodiments.
Figure 6B:
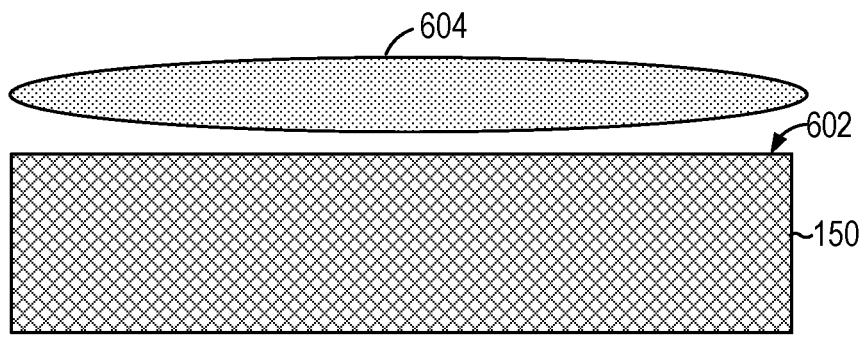

FIGS. 6A and 6B are cross-sectional views of the intermediate handle wafer structure and the target wafer, respectively, during plasma activation in accordance with various embodiments. Plasma activation involves treating the bonding surfaces 600 of the die 104, the bonding surface 602 of the target wafer 150, or both, with a suitable plasma 604, such as a nitrogen-based or oxygen-based plasma generated from the respective molecular gases (and, e.g., using helium as a carrier gas) by electric discharge. This exposure tends to improve the adhesion properties of the surfaces 600, 602, e.g., via a combination of ultra-fine surface cleaning from contaminants and surface functionalization to facilitate subsequent covalent bond formation Plasma activation may also be useful, although it may not be needed, when the tether material 106 is retained. Following plasma activation, the intermediate handle wafer structure 500 can be flipped, and placed die-down onto the target wafer 150.

Figure 7:
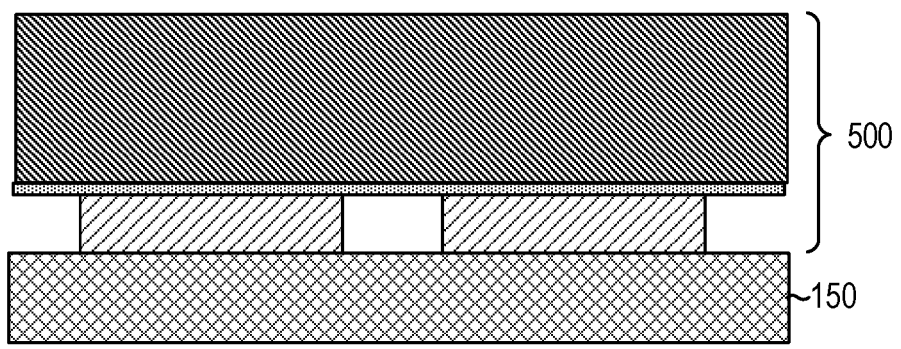
FIG. 7 is a cross-sectional view of the intermediate handle wafer structure positioned die-down on the target wafer, in accordance with various embodiments.

FIG. 7 is a cross-sectional view of the intermediate handle wafer structure 500 positioned die-down on the target wafer 150, in accordance with various embodiments. Prior to this step, the target wafer 150 has typically been patterned (not shown) to form various device structures, such as, e.g., waveguides, in the device layer of the target wafer 150. The die 104 of the intermediate handle wafer structure 500 may be aligned relative to these device structures, e.g., using infrared through-wafer alignment, where the device structures themselves and/or fiducials created in the target wafer 150 specifically for alignment purposes are rendered visible by an infrared backside illumination source that shines light through the target wafer 150 and intermediate handle wafer structure 500. Alternative alignment processes may be utilized instead. Following alignment and placement of the intermediate handle wafer structure 500 onto the target wafer 150, an initial bond is formed between the bonding surfaces 600, 602 of the die 104 and the target wafer 150.

Figure 8:
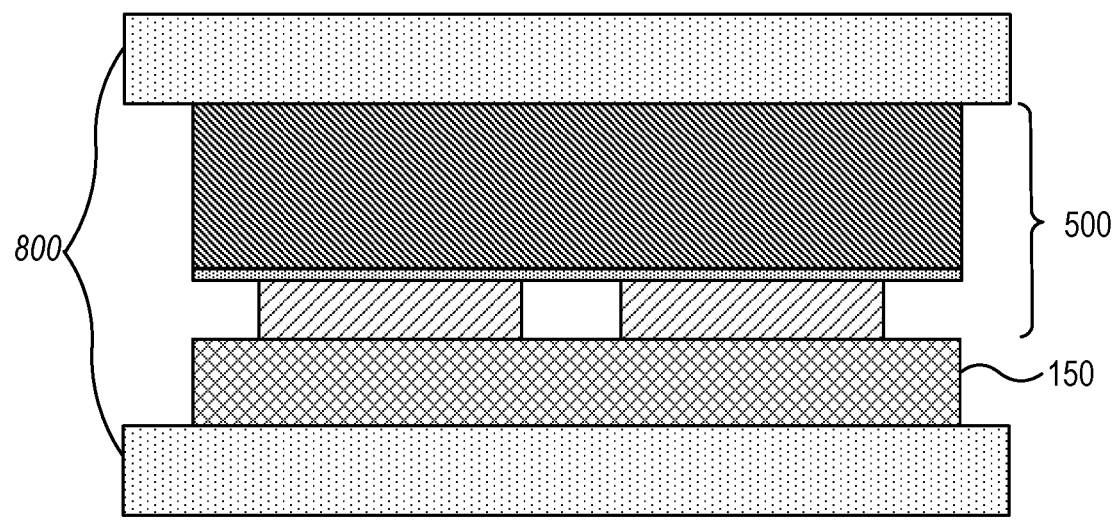
FIG. 8 is a cross-sectional view of the intermediate handle wafer structure bonded to the target wafer during wafer bonding in accordance with various embodiments.

FIG. 8 is a cross-sectional view of the intermediate handle wafer structure 500 bonded to the target wafer 150 during wafer bonding in accordance with various embodiments. Wafer bonding may involve annealing the initial bond formed when the bonding surfaces where brought in contact by applying a combination of heat and pressure, e.g., in an anneal press 800. A typical annealing process may expose the bonded intermediate handle wafer structure 500 and target wafer 150 to pressures exceeding 0.25 N/mm$^2$ and a temperature between 250° C. and 350° C. for a time period of, e.g., about an hour. Alternatively, bond formation can be completed in a vacuum-assisted wafer bonder by pulling a vacuum between the intermediate handle wafer structure 500 and the target wafer 150. After completion of bonding, the bonded structure is removed from the anneal press 800 or vacuum-assisted wafer bonder.

Figure 9:
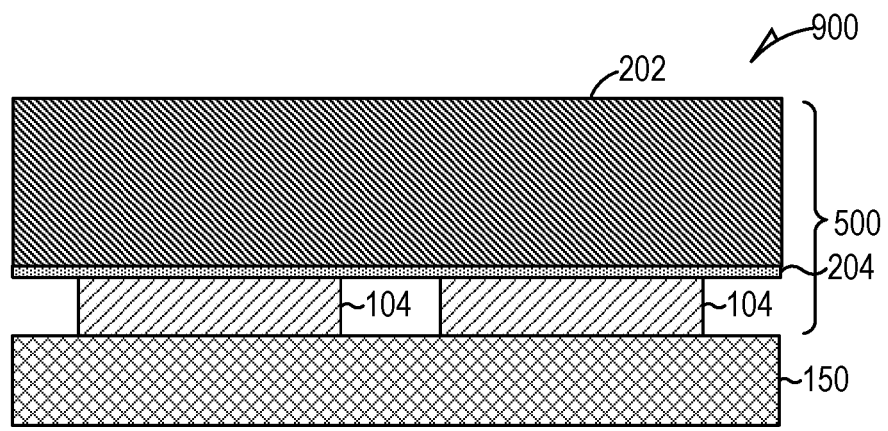
FIG. 9 is a cross-sectional view of the intermediate handle wafer structure bonded to the target wafer upon completion of wafer bonding in accordance with various embodiments.

FIG. 9 is a cross-sectional view of the intermediate handle wafer structure 500 bonded to the target wafer 150 (collectively, structure 900) upon completion of wafer bonding in accordance with various embodiments. The substrate 202 and adhesive layer 204 of the intermediate handle wafer 200 can now be removed, e.g., by etching, selectively etching the adhesive layer 204 and lifting off the substrate 202, lapping, or otherwise.

Figure 10:
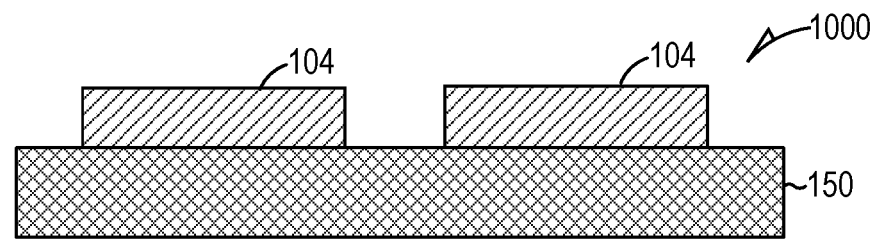
FIG. 10 is a cross-sectional view of die bonded to the target wafer at completion of die-wafer-bonding utilizing micro-transfer printing in accordance with various embodiments.

FIG. 10 is a cross-sectional view of die 104 bonded to the target wafer 150 at completion of die-wafer-bonding utilizing micro-transfer printing in accordance with various embodiments. The bonded heterogeneous structure 1000 can now be further processed, e.g., using a sequence of lithographic patterning and etching steps alternatingly with additional material deposition steps, to form the heterogeneous devices in the die and the target wafer underneath.

Figure 11:
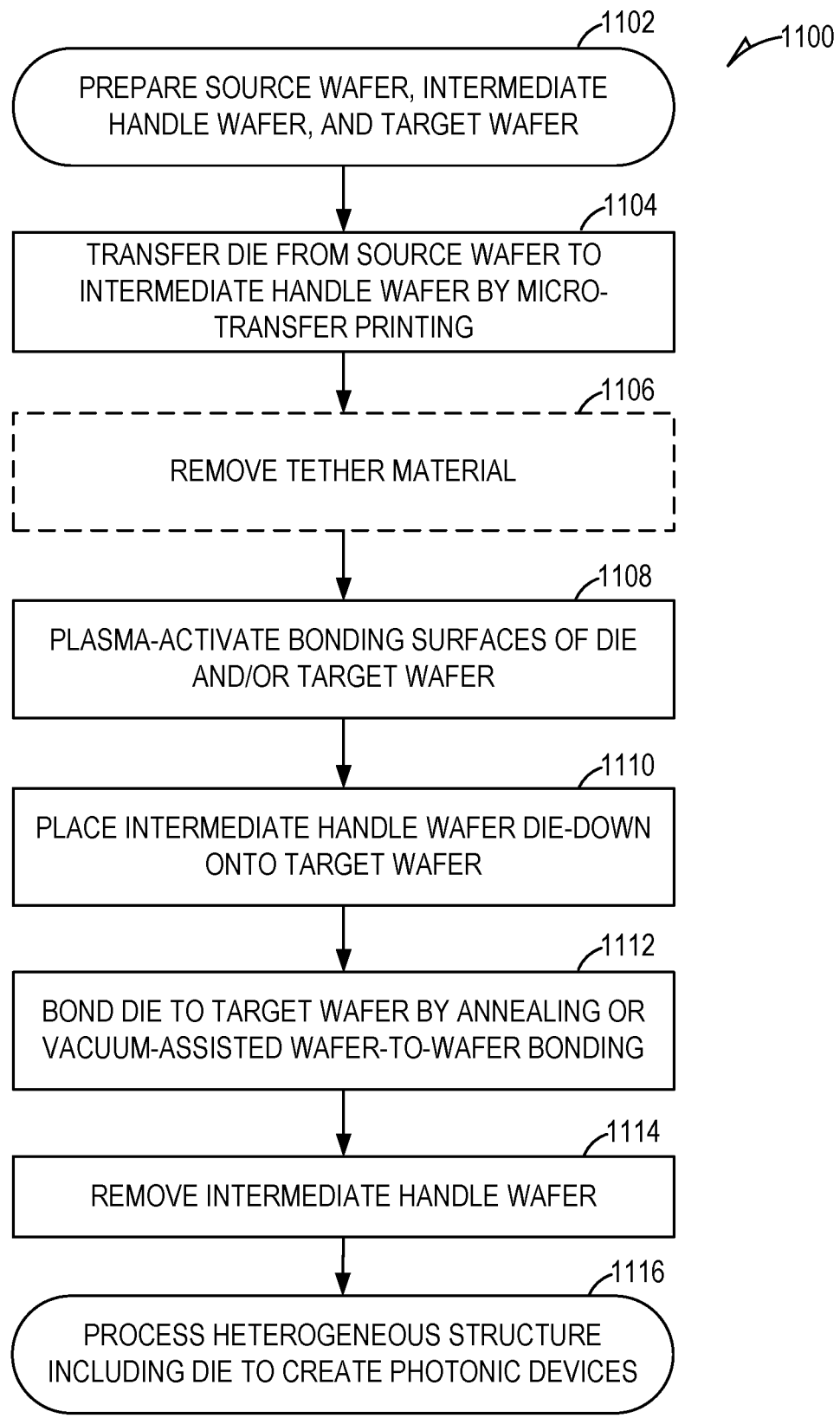
FIG. 11 is a flow chart of a process for die-to-wafer bonding utilizing micro-transfer printing in accordance with various embodiments.

FIG. 11 is a flow chart summarizing a process 1100 for die-to-wafer bonding utilizing micro-transfer printing in accordance with various embodiments. The process 1100 begins, at 1102, with the preparation of the source wafer 100, intermediate handle wafer 200, and target wafer 150, using techniques well-known to those of ordinary skill in the art. Source wafer preparation may involve depositing sacrificial material on a substrate, growing epi layers, coating the wafer with a tether material, and preferentially etching channels and undercuts to form die 104 in the epi layers. Intermediate handle wafer preparation may include coating a suitable substrate with an adhesive layer. Target wafer preparation may involve patterning an SOI or similar substrate to create device structures.

In act 1104, micro-transfer printing, e.g., by means of a conventional or custom micro-transfer printing stamp 114, is used to pick the die 104 from the source wafer 100 and transfer them to the intermediate handle wafer 200, e.g., one die 104 at a time or in groups, depending on the application. During the transfer process, the die 104 may attach to the stamp via tether material 106 disposed over the source wafer 100. A high-precision pick-and-place machine (e.g., from AMICRA Microtechnologies GmbH, Regensburg, Germany) may be employed to move the stamp and attached die 104. Following die transfer, the tether material 106 may optionally be removed (e.g., by wet-etching) (act 1106). Alternatively, the tether material may be kept for incorporation into the devices ultimately formed on top of the target wafer 150.

In the next act 1108, the bonding surfaces of the die 104 and/or the target wafer 150 may be plasma-activated to improve adhesion properties and enable covalent bonding. The intermediate handle wafer structure 500 including the die 104 is then flipped, aligned with the target wafer 150, and placed die-down onto the target wafer 150, forming initial bonds between the die 104 and the target wafer 150 upon contact (act 1110). Bonding formation is finished, e.g., in an anneal press under elevated temperature and/or pressure or in a vacuum-assisted wafer bonder (act 1112). Upon completion of bonding, the intermediate wafer substrate and adhesive layer can be removed, e.g., by a wet etch (act 1114), leaving only the die 104 bonded to the target wafer 150. The bonded structure is now ready for further processing steps to create heterogeneous photonic device structures (act 1116).

The disclosed approach enabling the use of micro-transfer printing in the die-to-wafer bonding process allows the die size to be significantly reduced (e.g., by an order of magnitude in one or both lateral dimensions) and, thus, the device density within a PIC to be increased. Smaller die may translate into savings in material cost. In conventional bonding processes, the die size required for handling is, in some cases, significantly larger than the device structure to be formed from the die; in these cases, a large portion of the die material is lost to the etch process that creates the device structures. The ability to handle smaller die, using the disclosed micro-transfer-printing-based approach, may allow the use of die that are only slightly larger than the ultimate device structure. For example, for certain integrated lasers and electro-absorption modulators, rectangular III-V die having a larger dimension of less than 2 mm, or less than 1 mm in some embodiments, and a smaller dimension of less than 200 µm, or less than 100 µm in some embodiments, may be used. Further, using the disclosed micro-transfer-printing-based bonding process, die cut from different epi layer structures may be combined on the same target wafer (e.g., SOI wafer) to make different photonic devices with suitably tailored material properties. Thus, the increased device density achievable with the disclosed approach is not limited to devices sharing a common epi layer structure. Combining multiple devices with different epi layer structures would not be possible if the multiple device structures were, by contrast, simply formed from a single, larger die. It is also worth noting that, in the disclosed process, the die are bonded directly to the target wafer, e.g., directly to the device layer of an SOI substrate or to a thin insulating (e.g., oxide) layer disposed above the device layer (rather than to an intervening structures such as solder pads on the target wafer). Beneficially, die-to-wafer bonding utilizing micro-transfer printing in accordance with various embodiments can be implemented using commercially available fabrication apparatus and tools, and process steps amenable to high-throughput fabrication, and allows bonding the die directly to the target wafer (e.g., to the device layer, or to a thin insulating layer disposed thereon).

The following numbered examples are illustrative embodiments.

1. A method comprising: transferring, by micro-transfer printing, a plurality of die from a source wafer onto an intermediate handle wafer comprising a substrate coated with an adhesive layer to create an intermediate handle wafer structure including the die; bonding the intermediate handle wafer structure die-down onto a target wafer; and removing the substrate and adhesive layer of the intermediate handle wafer, leaving the die bonded to the target wafer.

2. The method of example 1, wherein bonding the intermediate handle wafer structure die-down onto the target wafer comprises plasma-activating at least one of bonding surfaces of the plurality of die or a bonding surface of the target wafer, and placing the intermediate handle wafer structure die-down onto the target wafer to cause formation of an initial bond between the plurality of die and the target wafer.

3. The method of example 2, wherein bonding the intermediate handle wafer structure die-down onto the target wafer further comprises aligning the intermediate handle wafer structure with the target wafer prior to causing initial bond formation.

4. The method of example 2 or example 3, wherein bonding the intermediate handle wafer structure die-down onto the target wafer further comprises annealing the initial bond by application of heat and pressure.

5. The method of example 2 or example 3, wherein bonding the intermediate handle wafer structure die-down onto the target wafer further comprises vacuum-assisted wafer-to-wafer bonding.

6. The method of any of examples 1-5, further comprising forming the die in the source wafer by selectively etching a lift-off layer formed in the source wafer between a substrate layer and a layer comprising the die.

7. The method of any of examples 1-6, wherein the source wafer comprises a top layer of tether material from which the die are suspended, wherein transferring the plurality of die comprises picking the die from the source wafer and placing the die onto the adhesive layer of the intermediate handle wafer using a micro-transfer printing stamp brought in contact with the tether material at locations of the die.

8. The method of example 7, further comprising removing the tether material from the die prior to bonding the intermediate handle wafer structure die-down onto the target wafer.

9. The method of example 8, wherein the tether material is removed by a wet etch.

10. The method of example 7, wherein the tether material is kept on the die to form part of a device structure of a device to be formed in the die.

11. The method of any of examples 7-10, wherein the tether material comprises at least one of a silicon nitride, a silicon oxide, or photoresist.

12. The method of any of examples 1-11, wherein the die comprise a plurality of layers of material, at least one of the layers differing from a material of the target wafer.

13. The method of any of examples 1-12, wherein the die comprise one or more compound semiconductor materials and the target wafer is a silicon-on-insulator wafer.

14. The method of any of examples 1-13, wherein the adhesive layer comprises at least one of an epoxy or a photoresist.

15. The method of any of examples 1-14, wherein the substrate and adhesive layer of the intermediate handle wafer are removed by wet etching.

16. The method of any of examples 1-15, further comprising patterning the target wafer prior to bonding the intermediate handle wafer structure die-down onto a target wafer.

17. The method of any of examples 1-16, further comprising patterning the die after bonding the intermediate handle wafer structure die-down onto a target wafer and removing the substrate and adhesive layer of the intermediate handle wafer.

18. The method of any of examples 1-17, wherein the die have lateral dimensions of less than 500 μm.

19. The method of any of examples 1-18, wherein the die have a smallest lateral dimensions of less than 100 μm.

20. A semiconductor structure comprising: a silicon-on-insulator (SOI) substrate; and, bonded to the SOI substrate, a die of III-V material, a smallest lateral dimension of the die being less than 100 μm, wherein bonding of the die to the SOI substrate results from: transferring the die by micro-transfer printing from a source wafer onto an intermediate handle wafer comprising a substrate coated with an adhesive layer to create an intermediate handle wafer structure including the die, bonding the intermediate handle wafer structure die-down onto the SOI substrate, and removing the substrate and adhesive layer of the intermediate handle wafer, leaving the die bonded to SOI substrate.

21. The semiconductor structure of example 20, further comprising: bonded to the SOI substrate, a second die of III-V material, a smallest lateral dimension of the second die being less than 100 μm, the first and second die of III-V material differing in epi layer structure.

Although the inventive subject matter has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense.

What is claimed is:

1. A method comprising: transferring, by micro-transfer printing, a plurality of die from a source wafer onto an intermediate handle wafer comprising a substrate coated with an adhesive layer to create an intermediate handle wafer structure including the plurality of die, wherein the source wafer comprises a top layer of tether material from which the plurality of die are suspended, and wherein transferring the plurality of die comprises picking the plurality of die from the source wafer and placing the plurality of die onto the adhesive layer of the intermediate handle wafer using a micro-transfer printing stamp brought in contact with the tether material at locations of the plurality of die; bonding the intermediate handle wafer structure die-down onto a target wafer, the bonding comprising plasma-activating at least one of bonding surfaces of the plurality of die or a bonding surface of the target wafer, and placing the intermediate handle wafer structure die-down onto the target wafer to cause formation of an initial bond between the plurality of die and the target wafer; and removing the substrate and the adhesive layer of the intermediate handle water, leaving the plurality of die bonded to the target wafer.

2. The method of claim 1, wherein bonding the intermediate handle wafer structure die-down onto the target wafer further comprises aligning the intermediate handle wafer structure with the target water prior to causing initial bond formation.

3. The method of claim 1, wherein bonding the intermediate handle wafer structure die-down onto the target wafer further comprises annealing the initial bond by application of heat and pressure.

4. The method of claim 1, wherein bonding the intermediate handle wafer structure die-down onto the target wafer further comprises vacuum-assisted wafer-to-wafer bonding.

5. The method of claim 1, further comprising forming the plurality of die in the source wafer by selectively etching a lift-off layer formed in the source water between a substrate layer and a layer comprising the plurality of die.

6. The method of claim 1, further comprising removing the tether material from the plurality of die prior to bonding the intermediate handle wafer structure die-down onto the target wafer.

7. The method of claim 6, wherein the tether material is removed by a wet etch.

8. The method of claim 1, wherein the tether material is kept on the plurality of die to form part of a device structure of a device to be formed in the plurality of die.

9. The method of claim 1, wherein the tether material comprises at least one of a silicon nitride, a silicon oxide, or photoresist.

10. The method of claim 1, wherein the plurality of die comprise a plurality of layers of material, at least one of the layers differing from a material of the target water.

11. The method of claim 1, wherein the plurality of die comprise one or more compound semiconductor materials and the target wafer is a silicon-on-insulator wafer.

12. The method of claim 1, wherein the adhesive layer comprises at least one of an epoxy or a photoresist.

13. The method of claim 1, wherein the substrate and adhesive layer of the intermediate handle wafer are removed by wet etching.

14. The method of claim 1, further comprising patterning the target wafer prior to bonding the intermediate handle wafer structure die-down onto a target wafer.

15. The method of claim 1, further comprising patterning the plurality of die after bonding the intermediate handle wafer structure die-down onto a target wafer and removing the substrate and adhesive layer of the intermediate handle wafer.

16. The method of claim 1, wherein the plurality of die have a smallest lateral dimensions of less than 100 mm.

* * * * *